United States Patent [19]

Karpovich

[11] Patent Number: 5,523,612
[45] Date of Patent: Jun. 4, 1996

[54] METHOD OF MANUFACTURING AN ANTIFUSE WITH DOPED BARRIER METAL LAYER AND RESULTING ANTIFUSE

[75] Inventor: Yakov Karpovich, Campbell, Calif.

[73] Assignee: Crosspoint Solutions, Inc., Santa Clara, Calif.

[21] Appl. No.: 154,842

[22] Filed: Nov. 19, 1993

[51] Int. Cl.$^6$ .................................................. H01L 29/00
[52] U.S. Cl. ........................... 257/530; 257/50; 257/751; 257/764; 257/770
[58] Field of Search ........................... 257/530, 50, 751, 257/764, 770

[56] References Cited

U.S. PATENT DOCUMENTS

| | | | |
|---|---|---|---|
| 4,424,578 | 1/1984 | Miyamoto | 257/530 |
| 4,499,557 | 2/1985 | Holmberg et al. | 257/530 |
| 4,680,612 | 7/1987 | Hieber et al. | 257/757 |
| 4,680,854 | 7/1987 | Ho et al. | 29/576 |
| 4,980,752 | 12/1990 | Jones, Jr. | 257/763 |
| 5,106,773 | 4/1992 | Chen et al. | 437/51 |
| 5,210,043 | 5/1993 | Hosaka | 437/200 |

FOREIGN PATENT DOCUMENTS

| | | | |
|---|---|---|---|
| 0455414 | 11/1992 | European Pat. Off. | 257/530 |

*Primary Examiner*—J. Carroll
*Attorney, Agent, or Firm*—Townsend and Townsend and Crew

[57] ABSTRACT

A method of forming an antifuse in an integrated circuit having an insulating layer on a semiconductor substrate is provided. The method comprises forming a first metal interconnection layer on the insulating layer; forming a first barrier metal layer on the first metal interconnection layer; forming an amorphous silicon layer on the first barrier metal layer; forming another barrier metal layer atop the amorphous silicon layer; and forming a second metal interconnection layer on the second barrier metal layer. In at least one of the barrier metal forming steps, the barrier metal is formed by sputtering a barrier metal target which includes a semiconductor dopant, such as dopant.

7 Claims, 2 Drawing Sheets

VOLTAGE VERSUS CURRENT FOR TYPICAL ANTIFUSE

5,523,612

METHOD OF MANUFACTURING AN ANTIFUSE WITH DOPED BARRIER METAL LAYER AND RESULTING ANTIFUSE

BACKGROUND OF THE INVENTION

The present invention is related to integrated circuit structure and processing technology and, more particularly, to antifuses in integrated circuits and their manufacture.

Antifuses are found in a growing number of integrated circuits, most of which are field programmable gate arrays (FPGAs). As the name implies, antifuses have a very high resistance (to form essentially an open circuit) in the unprogrammed ("off") state, and a very low resistance (to form essentially a short circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a layer of amorphous silicon (α-Si) is sandwiched between two metal interconnection lines. Depending upon the material of each metal interconnection line, a layer of barrier metal, such as TiW (titanium-tungsten), is placed between the amorphous silicon layer and each metal interconnection line. Barrier metal layers block the undesired interdiffusion of a semiconductor layer, amorphous silicon, and a metal layer, such as aluminum alloy. Barrier metal layers are typically refractory metals, their intermetallics, alloys, silicides, nitrides and combinations thereof.

However, various problems have been found with present antifuses. One problem is that the programmed resistance ($R_{ON}$) typically varies between 20 to 50 ohms. While these values are low enough for FPGA's to operate quite adequately, even lower resistance values would significantly improve performance. Thus a goal of any antifuse is to lower $R_{ON}$ as much as possible.

A second problem with present antifuses is that $R_{ON}$ is sometimes unstable. With use, the programmed resistance of the antifuse sometimes drifts and increases to very high values which result in a device failure. For the programmed FPGA, the failure of one antifuse is disastrous since the programmed circuit is no longer realized in the integrated circuit.

The present invention solves or substantially mitigates these problems.

SUMMARY OF THE INVENTION

The present invention provides for a method of forming an antifuse in an integrated circuit having an insulating layer on a semiconductor substrate. The method comprises forming a first metal interconnection layer on the insulating layer; forming a first barrier metal layer on the first metal interconnection layer; forming an amorphous silicon layer on the first barrier metal layer; forming another barrier metal layer atop the amorphous silicon layer; and forming a second metal interconnection layer on the second barrier metal layer. In at least one of the barrier metal forming steps, the barrier metal is formed by sputtering a barrier metal target which includes a semiconductor dopant, such as boron.

The present invention also provides for an integrated circuit having at least one antifuse which is formed from first and second conducting lines; an amorphous silicon layer between the first and second conducting lines; and a barrier metal layer including a semiconductor dopant material, between the amorphous silicon layer and one of the conducting lines. When programmed, the resistance and reliability of the antifuse is enhanced by the delivery of the dopant from the barrier metal layer into the antifuse link which is formed.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENTS

Figure 1:
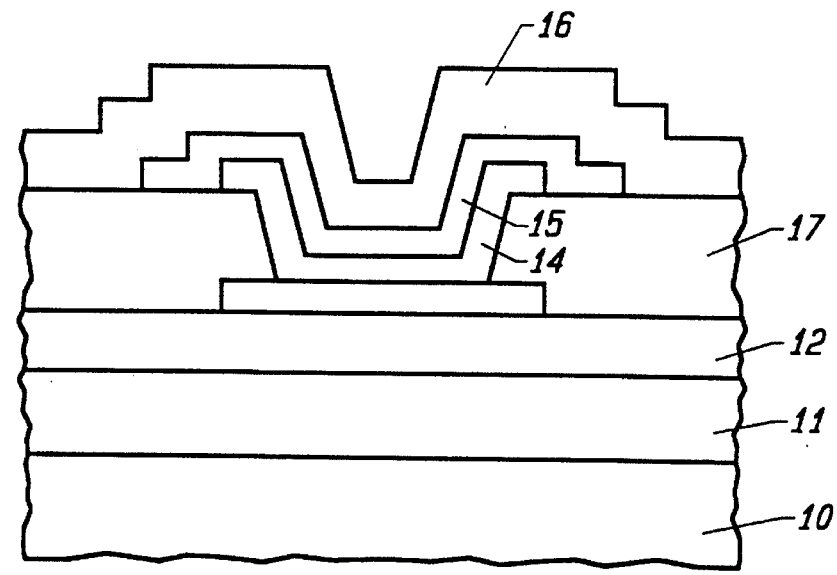
FIG. 1 is a cross-sectional diagram of a representative antifuse found in the prior art.

FIG. 1 shows a cross-sectional view of a typical antifuse. The antifuse has a first metal interconnection layer 12 on top of an insulating layer 11 of silicon dioxide. The insulating layer 11 is formed on top of a semiconductor substrate 10 upon whose surface are formed various elements of an integrated circuit. These elements, such as transistors, are not shown in the drawings.

The first metal interconnection layer 12 is typically formed from aluminum alloy. The layer 12 is delineated into one set of metal interconnection lines for the integrated circuit. A first barrier metal layer 13 is formed on top of the first metal interconnection layer 12. A second insulating layer 17 of silicon dioxide is placed over the first metal interconnection layer 12 and the barrier metal layer 13. Though a via through the layer 17, a programming layer 14 of amorphous silicon is formed over the insulating layer 17 to contact the first barrier metal layer 13. As explained above, the barrier metal layer 13 prevents the interdiffusion of the aluminum in the metal interconnection layer 12 with the silicon in the amorphous silicon layer 14.

On top of the amorphous silicon layer 14, there is placed another barrier metal layer 15, followed by a second metal interconnection layer 16. The layer 16 is delineated into another set of metal interconnection lines for the integrated circuit.

Figure 2:
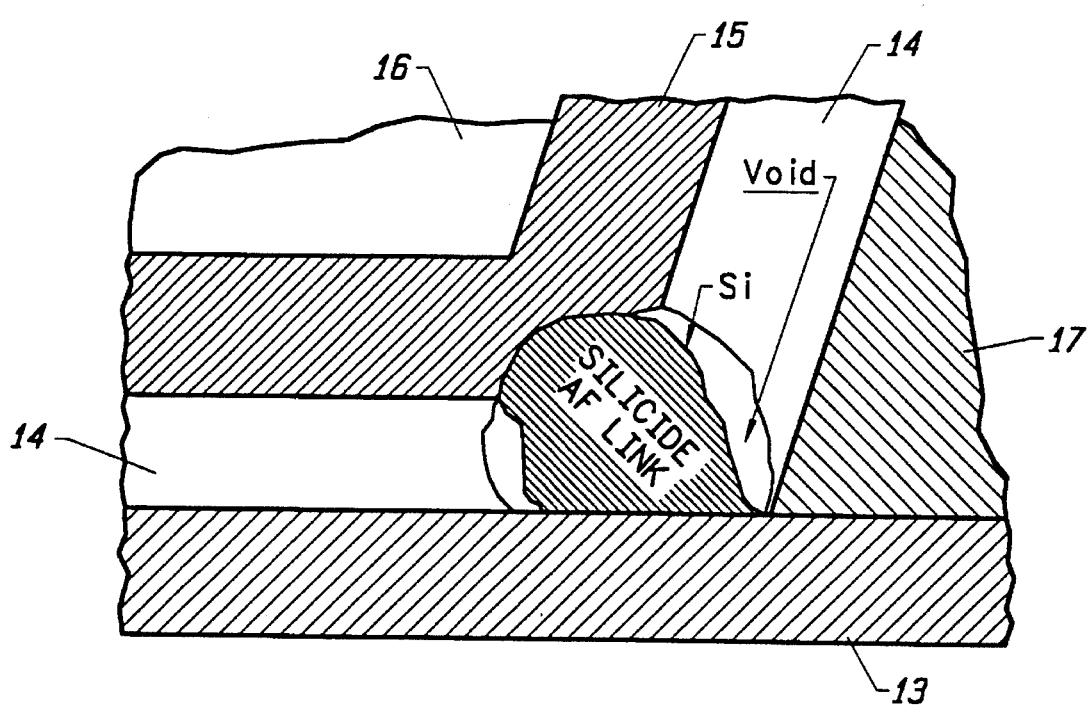
FIG. 2 is a detailed representational view of the corner of the antifuse of FIG. 1 after programming.

Shown in FIG. 2 is a detailed view of the antifuse shown in FIG. 1. When an antifuse is programmed, a conducting link is formed through the amorphous silicon layer 14 between the barrier metal layers 13 and 15. The conducting link is formed by the higher electric field at the beginning of the programming process. This field causes a breakdown of the amorphous silicon layer 14 and the resulting high current densities melt the intermediate amorphous silicon layer 14 and the barrier metal layer 13 or 15, whichever is negative at the time of breakdown, into the fused link.

The melted amorphous silicon mixes with the melted TiW. The solidification of the melted material into the antifuse link has two portions, TiW silicide and undoped high resistance silicon, with voids. The voids are about equal to the volume of the melted barrier metal material, TiW in the present case. The ratio of the silicide and the silicon in the antifuse link depends mostly upon the geometry of the antifuse structure.

Figure 3:
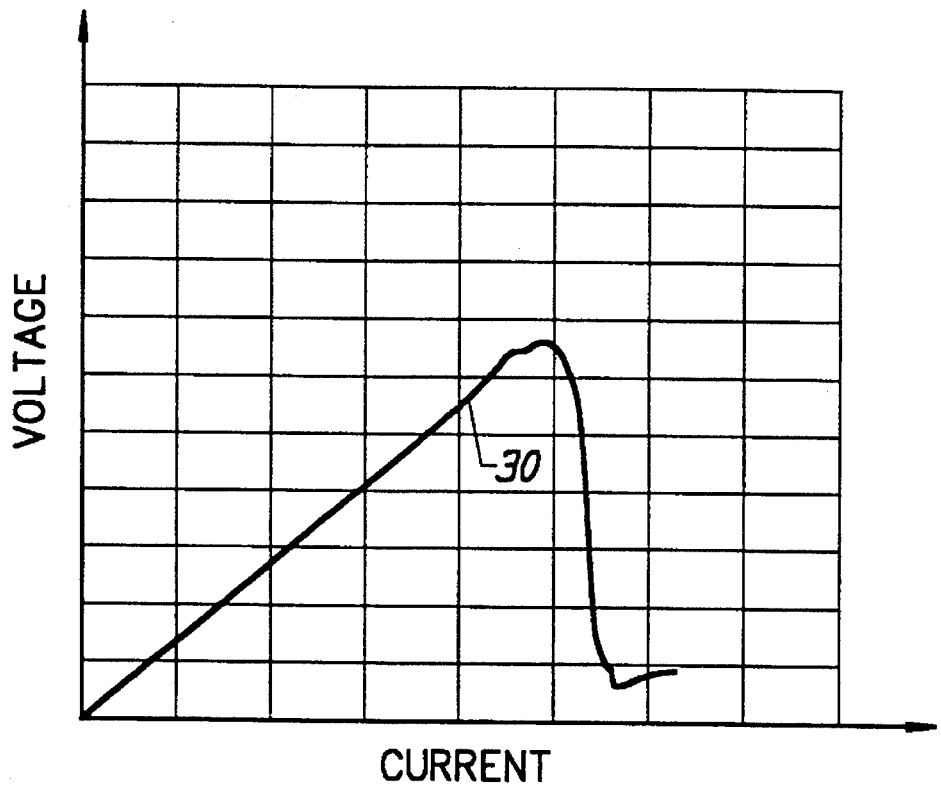
FIG. 3 is a representative graph which illustrates the failure mechanism of an antifuse with use.

Thus if the high resistance portion of the link were made conducting, the $R_{ON}$ of the programmed antifuse would be lowered. Another result would be the improved reliability of the programmed antifuse. Failure of a programmed antifuse is known as a read disturb phenomenon or "switch-off", by which the antifuse undergoes transformation from a low resistance state to a high resistance state. The current-voltage characteristic of switch-off is shown in FIG. 3. Based upon the understanding above of antifuse link formation, the "switch-off" is viewed as the melting of the link at a certain current density. Upon melting, the link loses its continuity as the material of the link fills in the adjacent voids. The antifuse is open.

To address these problems, the present invention is directed toward making the high resistance silicon of the link conducting. $R_{ON}$ is lowered and, since the conductive cross section area of the conducting link is effectively increased by making the high resistance silicon conductive, the problem of switch-off is substantially mitigated.

In accordance with the present invention, the TiW metal layers 13 and 15 are deposited by sputtering from a TiW target with a semiconductor dopant, boron. Upon the programming of the antifuse, the melted TiW layers 13 and 15 should effect a 1 atm. % doping of the silicon volume as the boron dopants are delivered from the layers 13 or 15 to the link during the melting process. This lowers the $R_{on}$ resistance up to an order of magnitude.

To achieve this, the same process steps are used as for prior art antifuses. The exception is that for the processing of the barrier metal layer 13 and 15, a target of TiWB with 5–30 atm. % boron is used. The particular amount of boron which is most efficacious depends upon the particular sputtering system and target configuration. The TiWB material is sputtered onto the substrate bearing the antifuse during the manufacturing process.

Furthermore, while it is contemplated that both layers 13 and 15 should be doped, the programming mechanism is understood to require that only the barrier metal layer which is negative with respect to the other barrier metal layer during programming be doped. Under these circumstances the dopants mix with the melted silicon. In the drawings above, the barrier metal layer 15 is the negative layer during programming.

While the above is a complete description of the preferred embodiments of the invention, various alternatives, modifications and equivalents may be used. It should be evident that the present invention is equally applicable by making appropriate modifications to the embodiments described above. For example, while the present invention has been described with TiW as the barrier metal and boron as the semiconductor dopant, one can readily appreciate that the present invention is applicable to other barrier metals and to other semiconductor dopants. Furthermore, while a programming layer of amorphous silicon has been described, other semiconductor materials may be used in place of the amorphous silicon. These materials include single layers of silicon dioxide or silicon nitride, or combinations of silicon dioxide, silicon nitride, and amorphous silicon layers in multilayered or sandwich structures.

Furthermore, the present invention has been described in the context of an antifuse structure between two metal interconnection lines of an integrated circuit. The integrated circuit should not considered as limited to only two metal interconnection-lines. The antifuse according to the present invention may be located between any two metal interconnection lines in an integrated circuit having multiple layers of metal interconnection lines.

Therefore, the above description should not be taken as limiting the scope of the invention, which is defined by the appended claims.

What is claimed is:

1. In an integrated circuit an antifuse comprising first and second conducting layers;

a programming semiconductor layer between said first and second conducting layers; and a barrier metal layer including TiWB, said barrier metal layer between said semiconductor layer and said first conducting layer;

whereby the resistance of said antifuse when said antifuse is programmed is reduced by the interaction of said programming layer and boron in said TiWB.

2. In an integrated circuit having a semiconductor substrate and an insulating layer formed thereover, an antifuse comprising a first metal interconnection layer on said insulating layer;

a first barrier metal layer on said first metal conducting layer;

an amorphous silicon layer on said first barrier metal layer;

a second barrier metal layer on said amorphous silicon layer; and a second metal interconnection layer on said second barrier metal layer;

at least one of said barrier metal layers formed by sputtering a target of TiWB whereby the resistance of said antifuse when said antifuse is programmed is reduced by the interaction of said amorphous silicon layer and boron of said TiWB.

3. The antifuse of claim 1 wherein said at least one barrier metal layer has sufficient boron such that upon programming said antifuse there is formed a fused link having silicon doped to 1 atm. % boron.

4. The antifuse of claim 2 wherein said TiWB target has 5–30 atm. % boron.

5. A method of forming an antifuse in an integrated circuit having an insulating layer on a semiconductor substrate, said method comprising forming a first digital interconnection layer on said insulating layer;

forming a first barrier metal layer on said first metal interconnection layer;

forming a semiconductor programming layer on said first barrier metal layer;

forming a second barrier metal layer on said programming layer; and forming a second metal interconnection layer on said second barrier metal layer;

wherein in at least one of said barrier metal forming steps, said barrier metal is formed by sputtering a target of TiWB.

6. The method of claim 5 wherein said sputtering step comprises sputtering a TiWB target having 5–30 atm. % boron.

7. The method of claim 5 wherein said sputtering step comprises sputtering a TiWB target having sufficient boron so that, upon programming said antifuse, said boron is delivered from said at least one barrier metal layer to form a fused link having silicon doped with boron, said semiconductor programming layer including silicon.

* * * * *